(12) United States Patent
Fujiwara

(10) Patent No.: US 8,499,224 B2
(45) Date of Patent: Jul. 30, 2013

(54) REDUNDANT CODE GENERATION METHOD AND DEVICE, DATA RESTORATION METHOD AND DEVICE, AND RAID STORAGE DEVICE

(75) Inventor: Hideyasu Fujiwara, Tokyo (JP)

(73) Assignee: NEC Corporation, Tokyo (JP)

( * ) Notice: Subject to any disclaimer, the term of this patent is extended or adjusted under 35 U.S.C. 154(b) by 509 days.

(21) Appl. No.: 12/730,984

(22) Filed: Mar. 24, 2010

(65) Prior Publication Data

US 2010/0251071 A1 Sep. 30, 2010

(30) Foreign Application Priority Data

Mar. 31, 2009 (JP) ................................ 2009-085416

(51) Int. Cl.
*H03M 13/00* (2006.01)
(52) U.S. Cl.
USPC .......................................................... 714/781
(58) Field of Classification Search
USPC .......................................................... 714/781
See application file for complete search history.

(56) References Cited

U.S. PATENT DOCUMENTS

| 4,335,458 | A * | 6/1982 | Krol ............................... | 714/763 |
|---|---|---|---|---|
| 6,219,815 | B1 * | 4/2001 | DesJardins et al. ........... | 714/781 |
| 6,671,850 | B1 * | 12/2003 | Cox et al. ....................... | 714/781 |
| 7,681,111 | B2 * | 3/2010 | Kobayashi ..................... | 714/801 |
| 2006/0195768 | A1 * | 8/2006 | Hassner et al. ................ | 714/781 |
| 2010/0031065 | A1 * | 2/2010 | Futa et al. ...................... | 713/194 |

FOREIGN PATENT DOCUMENTS

| JP | S56127908 A | 10/1981 |
|---|---|---|
| JP | S60223333 A | 11/1985 |
| JP | S62073336 A | 4/1987 |
| JP | H05197579 A | 8/1993 |
| JP | 2007129618 A | 5/2007 |
| JP | 2008176621 A | 7/2008 |
| JP | 2008186400 A | 8/2008 |

OTHER PUBLICATIONS

J. S. Plank, "A Tutorial on Reed-Solomon Coding for Fault-Tolerance in RAID-like Systems", Technical Report UT-CS-96-332, Department of Computer Science, University of Tennessee, 1996.
J. S. Plank et al., "Note: Correction to the 1997 Tutorial on Reed-Solomon Coding", Technical Report UT-CS-03-504, Department of Computer Science, University of Tennessee, Apr. 24, 2003.
Japanese Office Action for JP2009-085416 mailed on Feb. 5, 2013.

\* cited by examiner

*Primary Examiner* — Albert Decady
*Assistant Examiner* — Enam Ahmed

(57) ABSTRACT

A redundant code generation method includes: dividing original data into data strings; dividing each data string into a number of bit strings that accords with an extended Galois field operation; storing each of the bit string in a different memory area of a memory; and executing an exclusive OR operation among vectors, which are extracted from the respective bit strings stored in the memory, according to an operational expression to compute bit strings that make up redundant code data strings without carrying out a bit shift operation within the vectors. A predetermined plural number of bits is taken as a data unit and the number of bits as elements constituting each vector is equal to the data unit. The operational expression includes a companion matrix of a primitive polynomial of the Galois field and defined the generation of the redundant code data strings.

15 Claims, 9 Drawing Sheets

Redundant code string $P$ $$\begin{pmatrix} P_{00} \\ P_{01} \\ P_{02} \\ P_{03} \end{pmatrix} = I \begin{pmatrix} a_{00} \\ a_{01} \\ a_{02} \\ a_{03} \end{pmatrix} + I \begin{pmatrix} b_{00} \\ b_{01} \\ b_{02} \\ b_{03} \end{pmatrix} + I \begin{pmatrix} c_{00} \\ c_{01} \\ c_{02} \\ c_{03} \end{pmatrix} + I \begin{pmatrix} d_{00} \\ d_{01} \\ d_{02} \\ d_{03} \end{pmatrix}$$

Redundant code string $Q$ $$\begin{pmatrix} Q_{00} \\ Q_{01} \\ Q_{02} \\ Q_{03} \end{pmatrix} = I \begin{pmatrix} a_{00} \\ a_{01} \\ a_{02} \\ a_{03} \end{pmatrix} + T \begin{pmatrix} b_{00} \\ b_{01} \\ b_{02} \\ b_{03} \end{pmatrix} + T^4 \begin{pmatrix} c_{00} \\ c_{01} \\ c_{02} \\ c_{03} \end{pmatrix} + T^2 \begin{pmatrix} d_{00} \\ d_{01} \\ d_{02} \\ d_{03} \end{pmatrix}$$

Redundant code string $P$ $$\begin{pmatrix} P_{00} \\ P_{01} \\ P_{02} \\ P_{03} \end{pmatrix} = \begin{pmatrix} 1 & 0 & 0 & 0 \\ 0 & 1 & 0 & 0 \\ 0 & 0 & 1 & 0 \\ 0 & 0 & 0 & 1 \end{pmatrix} \begin{pmatrix} a_{00} \\ a_{01} \\ a_{02} \\ a_{03} \end{pmatrix} + \begin{pmatrix} 1 & 0 & 0 & 0 \\ 0 & 1 & 0 & 0 \\ 0 & 0 & 1 & 0 \\ 0 & 0 & 0 & 1 \end{pmatrix} \begin{pmatrix} b_{00} \\ b_{01} \\ b_{02} \\ b_{03} \end{pmatrix} + \begin{pmatrix} 1 & 0 & 0 & 0 \\ 0 & 1 & 0 & 0 \\ 0 & 0 & 1 & 0 \\ 0 & 0 & 0 & 1 \end{pmatrix} \begin{pmatrix} c_{00} \\ c_{01} \\ c_{02} \\ c_{03} \end{pmatrix} + \begin{pmatrix} 1 & 0 & 0 & 0 \\ 0 & 1 & 0 & 0 \\ 0 & 0 & 1 & 0 \\ 0 & 0 & 0 & 1 \end{pmatrix} \begin{pmatrix} d_{00} \\ d_{01} \\ d_{02} \\ d_{03} \end{pmatrix}$$

Redundant code string $Q$ $$\begin{pmatrix} Q_{00} \\ Q_{01} \\ Q_{02} \\ Q_{03} \end{pmatrix} = \begin{pmatrix} 1 & 0 & 0 & 0 \\ 0 & 1 & 0 & 0 \\ 0 & 0 & 1 & 0 \\ 0 & 0 & 0 & 1 \end{pmatrix} \begin{pmatrix} a_{00} \\ a_{01} \\ a_{02} \\ a_{03} \end{pmatrix} + \begin{pmatrix} 0 & 0 & 0 & 1 \\ 1 & 0 & 0 & 1 \\ 0 & 1 & 0 & 0 \\ 0 & 0 & 1 & 0 \end{pmatrix} \begin{pmatrix} b_{00} \\ b_{01} \\ b_{02} \\ b_{03} \end{pmatrix} + \begin{pmatrix} 1 & 0 & 0 & 1 \\ 1 & 1 & 0 & 1 \\ 0 & 1 & 1 & 0 \\ 0 & 0 & 1 & 1 \end{pmatrix} \begin{pmatrix} c_{00} \\ c_{01} \\ c_{02} \\ c_{03} \end{pmatrix} + \begin{pmatrix} 0 & 0 & 1 & 0 \\ 0 & 0 & 1 & 1 \\ 1 & 0 & 0 & 1 \\ 0 & 1 & 0 & 0 \end{pmatrix} \begin{pmatrix} d_{00} \\ d_{01} \\ d_{02} \\ d_{03} \end{pmatrix}$$

Bit shift is necessary for arithmetic operations.

$P_{00}=a_{00}+b_{00}+c_{00}+d_{00}$
$P_{01}=a_{01}+b_{01}+c_{01}+d_{01}$
⋮

$Q_{00}=a_{00}+b_{30}+c_{20}+d_{10}$
$Q_{01}=a_{01}+b_{31}+c_{21}+d_{11}$
⋮

$P_0 = a_0 + b_0 + c_0 + d_0$
$Q_0 = a_0 + b_3 + c_2 + d_1$
⋮

Bit shift operation is not necessary. Necessary are only simple exclusive OR operations between data.

$$\text{Data string } a \begin{pmatrix} a_0 \\ a_1 \\ a_2 \\ a_3 \end{pmatrix} = T^{11} \begin{pmatrix} c_0 \\ c_1 \\ c_2 \\ c_3 \end{pmatrix} + T \begin{pmatrix} d_0 \\ d_1 \\ d_2 \\ d_3 \end{pmatrix} + T^{12} \begin{pmatrix} P_0 \\ P_1 \\ P_2 \\ P_3 \end{pmatrix} + T^{11} \begin{pmatrix} Q_0 \\ Q_1 \\ Q_2 \\ Q_3 \end{pmatrix}$$

Sector string $c$, Sector string $d$, Sector string $P$, Sector string $Q$ $$\text{Data string } b \begin{pmatrix} b_0 \\ b_1 \\ b_2 \\ b_3 \end{pmatrix} = T^{12} \begin{pmatrix} c_0 \\ c_1 \\ c_2 \\ c_3 \end{pmatrix} + T^4 \begin{pmatrix} d_0 \\ d_1 \\ d_2 \\ d_3 \end{pmatrix} + T^{11} \begin{pmatrix} P_0 \\ P_1 \\ P_2 \\ P_3 \end{pmatrix} + T^{11} \begin{pmatrix} Q_0 \\ Q_1 \\ Q_2 \\ Q_3 \end{pmatrix}$$

↓

$$\text{Data string } a \begin{pmatrix} a_0 \\ a_1 \\ a_2 \\ a_3 \end{pmatrix} = \begin{pmatrix} 0 & 1 & 1 & 1 \\ 1 & 1 & 0 & 0 \\ 1 & 1 & 1 & 0 \\ 1 & 1 & 1 & 1 \end{pmatrix} \begin{pmatrix} c_0 \\ c_1 \\ c_2 \\ c_3 \end{pmatrix} + \begin{pmatrix} 0 & 0 & 0 & 1 \\ 1 & 0 & 0 & 1 \\ 0 & 1 & 0 & 0 \\ 0 & 0 & 1 & 0 \end{pmatrix} \begin{pmatrix} d_0 \\ d_1 \\ d_2 \\ d_3 \end{pmatrix} + \begin{pmatrix} 1 & 1 & 1 & 1 \\ 1 & 0 & 0 & 0 \\ 1 & 1 & 0 & 0 \\ 1 & 1 & 1 & 0 \end{pmatrix} \begin{pmatrix} P_0 \\ P_1 \\ P_2 \\ P_3 \end{pmatrix} + \begin{pmatrix} 0 & 1 & 1 & 1 \\ 1 & 1 & 0 & 0 \\ 1 & 1 & 1 & 0 \\ 1 & 1 & 1 & 1 \end{pmatrix} \begin{pmatrix} Q_0 \\ Q_1 \\ Q_2 \\ Q_3 \end{pmatrix}$$

$$\text{Data string } b \begin{pmatrix} b_0 \\ b_1 \\ b_2 \\ b_3 \end{pmatrix} = \begin{pmatrix} 1 & 1 & 1 & 1 \\ 1 & 0 & 0 & 0 \\ 1 & 1 & 0 & 0 \\ 1 & 1 & 1 & 0 \end{pmatrix} \begin{pmatrix} c_0 \\ c_1 \\ c_2 \\ c_3 \end{pmatrix} + \begin{pmatrix} 1 & 0 & 0 & 1 \\ 1 & 1 & 0 & 1 \\ 0 & 1 & 1 & 0 \\ 0 & 0 & 1 & 1 \end{pmatrix} \begin{pmatrix} d_0 \\ d_1 \\ d_2 \\ d_3 \end{pmatrix} + \begin{pmatrix} 0 & 1 & 1 & 1 \\ 1 & 1 & 0 & 0 \\ 1 & 1 & 1 & 0 \\ 1 & 1 & 1 & 1 \end{pmatrix} \begin{pmatrix} P_0 \\ P_1 \\ P_2 \\ P_3 \end{pmatrix} + \begin{pmatrix} 0 & 1 & 1 & 1 \\ 1 & 1 & 0 & 0 \\ 1 & 1 & 1 & 0 \\ 1 & 1 & 1 & 1 \end{pmatrix} \begin{pmatrix} Q_0 \\ Q_1 \\ Q_2 \\ Q_3 \end{pmatrix}$$

Sector string $c$, Sector string $d$, Sector string $P$, Sector string $Q$

FIG. 8

REDUNDANT CODE GENERATION METHOD AND DEVICE, DATA RESTORATION METHOD AND DEVICE, AND RAID STORAGE DEVICE

This application is based upon and claims the benefit of priority from Japanese patent Application No. 2009-085416, filed on Mar. 31, 2009, the disclosure of which is incorporated herein in its entirety by reference.

BACKGROUND OF THE INVENTION

1. Field of the Invention

The present invention relates to a method and device for generating redundant code based on data, a method and device for using the redundant code to restore original data, and a RAID (Redundant Array of Inexpensive Disks, or Redundant Array of Independent Disks) storage device that uses the redundant code.

2. Description of the Related Art

One technique for detecting various errors that can occur in data and correcting these errors involves generating redundant code based on data and adding this redundant code to the data. When redundant code is used to improve fault tolerance, data are used as is when errors do not occur in data, but when an error such as block loss occurs in the data, the redundant code is used to restore or recover the original data. Such redundant code is used in, for example, a RAID system.

A RAID system is a storage device configured by connecting a plurality of disk drives as a disk array, and to raise the reliability and speed of reading/writing, while conferring redundancy, records data that are both distributed and redundant on a plurality of disk drives. In a RAID system, fault tolerance is improved regarding the failure of disk drives, and data can be correctly read even when, for example, a failure occurs in one disk drive. RAID systems are classified into several types depending on the redundancy configuration, but of these types, as shown in James S. Plank, "*A Tutorial on Reed-Solomon Coding for Fault-tolerance in RAID-like Systems*," Technical Report UT-CS-96-332, University of Tennessee, July 1996 [1]; and James S. Plank and Ying Ding, "*Note: Correction to the* 1997 *Tutorial on Reed-Solomon Coding*," Technical Report UT-CS-03-504, University of Tennessee, April 2003 [2], the RAID 6 System, when dividing data into blocks and distributing and arranging the blocks in a plurality of disk drives, calculates Reed-Solomon code from the blocks and then stores this Reed-Solomon code in the disk drives together with the data that are divided into blocks. Reed-Solomon code is redundant code that uses an operation in a Galois field (i.e., finite field). To state in detail, a RAID 6 system uses a minimum of six disk drives, generates two types of parity codes (redundant codes) called P and Q, stores P-code data strings in one disk drive, stores Q-code data strings in another disk drive, and distributes and stores data in the remaining disks, and can thereby cope with failures in up to two disk drives of the whole.

Redundant code that employs a Galois field operation is known for its superior redundancy. Nevertheless, a Galois field operation represents a large processing burden for a general-purpose microprocessor or CPU (Central Processing Unit) and requires lengthy computation time. FIG. 1 is a view for describing the process of calculating redundant code, which is a Reed-Solomon code, in the related art of the present invention, and shows a process of generating redundant code strings P and Q from a bit string using a $2^4$-extended Galois field ($GF(2^4)$). Here, the data that are the object of the redundant code string generation are divided into the four bit strings a, b, c, and d. Bit string a is composed of bits $a_{00}$, $a_{01}$, $a_{02}$, $a_{03}$, ... and bit string b is composed of bits $b_{00}$, $b_{01}$, $b_{02}$, $b_{03}$, .... Bit strings c and d are similar. In addition, redundant code strings P and Q are also both bit strings, redundant code string P being composed of bits $P_{00}$, $P_{01}$, $P_{02}$, $P_{03}$, and redundant code string Q is composed of bits $Q_{00}$, $Q_{01}$, $Q_{02}$, $Q_{03}$, ....

Here, through the use of extended Galois field $GF(2^4)$, the computation of the redundant code strings is carried out by extracting four bits at a time from bit strings, and each of redundant code strings P and Q is also generated four bits at a time by a single computation shown in FIG. 1. In FIG. 1, I is a 4×4 identity matrix, and T is a companion matrix of the primitive polynomial ($x^4+x+1=0$) of $GF(2^4)$, and is the 4×4 matrix indicated by equation (1). In the figures and in the present specification, the explicit addition symbol ("+") does not indicate normal addition, but rather, indicates exclusive OR (XOR or eXclusive OR, ExOR) operation.

$$T = \begin{pmatrix} 0 & 0 & 0 & 1 \\ 1 & 0 & 0 & 1 \\ 0 & 1 & 0 & 0 \\ 0 & 0 & 1 & 0 \end{pmatrix}. \quad (1)$$

For example, $Q_{00}$ is calculated by:

$$Q_{00}=a_{00}+b_{03}+c_{00}+c_{03}+d_{02} \quad (2).$$

Because this is an exclusive OR operation, $Q_{00}$ is "1" if there is an odd number of bits having the value "1" among the five bits $a_{00}$, $b_{03}$, $c_{00}$, $c_{03}$, $d_{02}$, the value of $Q_{00}$ otherwise being "0."

Thus, an ordinary Galois field operation is carried out in bit units. Galois field operation is also implemented when using redundant code strings to restore original data.

However, a typical CPU or microprocessor executes operations in word units with, for example, eight bits (i.e., one byte), 16 bits, 32 bits or 64 bits as one word. Exclusive OR operations are also executed in the word units, and at such times, the exclusive OR is computed for corresponding bits between words that are the objects of computation. In other words, the result C of an exclusive OR operation for words A and B is also data of one word, the value of the exclusive OR of the first bit of word A and the first bit of word B being stored in the first bit of word C, and the result of the exclusive OR of the second bit of word A and the second bit of word B being stored in the second bit of word C.

When this type of CPU is used to execute the above-described Galois field operation, all of bit strings a to d can be treated as word data, but when computing, for example, redundant code string Q, the exclusive OR of bit $a_{00}$ that is the first bit of bit string a and bit $b_{03}$ that is the fourth bit of bit string b must be computed, as shown in equation (2). In other words, a bit shift operation must be carried out in the data. Still further, in an exclusive OR operation by word units, a mask operation of data in bit units must be carried out to prevent the operation result from being influenced by bits that are irrelevant to the operation at that point in time. The number of times this bit shift and data masking are executed is considerable. However, due to the architecture of a general-purpose CPU, bit shift instructions and data mask instructions cannot be efficiently executed, and these processes therefore place a heavy processing burden on the CPU.

When a general-purpose CPU is incorporated in a device, Galois field operations carried out by the CPU may affects the processing performance of the device. As a result, in the related art of the present invention, some type of hardware dedicated to Galois field operations for generating redundant code is considered essential to realize these operations at high speed. For example, JP-A-2007-129618 discloses an example in which a Galois field multiplying circuit necessary for Reed-Solomon decoding is made up from a hardware circuit composed of a large number of constituent elements.

For example, JP-A-2008-176621 discloses an example in which, to generate data to be stored in each disk drive in a RAID system, a general-purpose CPU is used to carry out a bit-shift operation, a data-mask operation, an AND operation, and an exclusive OR operation to carry out a Galois field multiplying operation. In addition, JP-A-2008-186400 discloses an example in which reference is made to a Galois field multiplication table to restore original data from data to which redundant code has been added by the method of JP-A-2008-176621.

Although there are cases in which Galois field operations are carried out using a general-purpose microprocessor or CPU as disclosed in JP-A-2008-176621 and JP-A-2008-186400, dedicated hardware capable of executing processes corresponding to bit shift at high speed must be employed when a Galois field operation is to be carried out at high speed. However, dedicated hardware for carrying out Galois field operations at high speed is costly, and a method is therefore sought that will enable Galois field operations to be executed at high speed using only a general-purpose CPU and without using special hardware.

SUMMARY OF THE INVENTION

It is an exemplary object of the present invention to provide a method and device that, without using special hardware, can carry out Galois field operations at high speed and generate redundant code.

It is another exemplary object of the present invention to provide a method and device that, without using special hardware, can carry out Galois field operations at high speed based on redundant code and restore original data.

It is yet another exemplary object of the present invention to provided a RAID storage device with improved performance that, without using special hardware, can carry out Galois field operations at high speed for redundant code generation and data restoration.

According to an exemplary aspect of the invention, a redundant code generation method for generating a redundant code data string by an extended Galois field operation from original data includes: dividing the original data into a plurality of data strings; dividing each of the data strings into a number of bit strings that accords with the extended Galois field operation; storing each bit string generated by the division in a different memory area of a memory; and executing an exclusive OR operation among vectors, which are extracted from the respective bit strings stored in the memory, according to an operational expression to compute bit strings that make up the redundant code data string without carrying out a bit shift operation within the vectors, a predetermined plural number of bits being taken as a data unit, the number of bits as elements constituting each of the vectors being equal to the data unit, the operational expression including a companion matrix of a primitive polynomial of the extended Galois field and defining the generation of the redundant code data string.

According to another exemplary aspect of the invention, a redundant code generation device for generating a redundant code data string by means of an extended Galois field operation from original data includes: an arithmetic device including at least an exclusive OR arithmetic circuit; a memory; and an address bus and data bus connecting the arithmetic device and the memory; wherein the original data are divided into a plurality of data strings; each of the data strings is divided into a number of bit strings that accords with the extended Galois field operation; and the memory includes a plurality of memory areas for storing each of the bit strings generated by the division, wherein the arithmetic device, taking a predetermined plural number of bits as a data unit, extracts vectors from the respective bit strings stored in the memory under address control that accords with an operational expression, executes an exclusive OR operation among the vectors to compute bit strings that make up the redundant code data string without carrying out a bit shift operation in the vectors, and stores the computed bit strings in corresponding memory areas in the memory, and wherein the number of bits as elements constituting each of the vectors is equal to the data unit, and the operational expression includes a companion matrix of a primitive polynomial of the extended Galois field and defines the generation of the redundant code data string.

According to yet another exemplary aspect of the invention, a data restoration method for, when original data have been divided into a plurality of data strings and a redundant code data string has been generated by means of an extended Galois field operation from the original data, restoring a data string, which has become faulty among the data strings, based on normal data strings and the redundant code data string to generate a restored data string includes: dividing each of the normal data strings and the redundant code data string into a number of bit strings that accords with the extended Galois field operation; storing each of the bit strings generated by the division in a different memory area of a memory; and executing an exclusive OR operation among vectors, which are extracted from the respective bit strings stored in the memory, according to an operational expression to compute bit strings that make up the restored data string without carrying out a bit shift operation in the vectors, a predetermined plural number of bits being taken as a data unit, the number of bits as elements constituting each of the vectors being equal to the data unit, the operational expression including a companion matrix of a primitive polynomial of the extended Galois field and defining the restoration of data strings.

According to still another exemplary aspect of the invention, a data restoration device for, when original data have been divided into a plurality of data strings and a redundant code data string has been generated by means of an extended Galois field operation from the original data, restoring a data string, which has become faulty among the data strings, based on normal data strings and the redundant code data string to generate a restored data string, includes: an arithmetic device including at least an exclusive OR arithmetic circuit; a memory; and an address bus and data bus connecting the arithmetic device and the memory; wherein each of the normal data strings and the redundant code data string is divided into a number of bit strings that accords with the extended Galois field operation; the memory includes a plurality of memory areas for storing each of the bit strings generated by the division, wherein the arithmetic device, taking a predetermined plural number of bits as a data unit, extracts vectors from the respective bit strings stored in the memory under address control that accords with an operational expression, executes an exclusive OR operation among the vectors to compute bit strings that make up the restored data string without carrying out a bit shift operation in the vectors, and stores the computed bit strings in corresponding memory areas in the memory, and wherein the number of bits as elements constituting each of the vectors is equal to the data unit, and the operational expression includes a companion matrix of a primitive polynomial of the extended Galois field and defines the restoration of data strings.

According to a further exemplary aspect of the invention, a RAID storage device includes: a plurality of data recording media; and an exclusive OR arithmetic circuit; wherein: original data are divided into a plurality of data strings and distributed and stored in the data recording media, and a redundant code data string found by means of an extended Galois field operation from the original data is stored in at least one of the data recording media; each the data string is divided into a number of bit strings that accords with the extended Galois field operation; the exclusive OR arithmetic circuit, taking a predetermined plural number of bits as a data unit, extracts vectors from the respective bit strings according to an operational expression which includes a companion matrix of a primitive polynomial of the extended Galois field, and executes exclusive OR operations among the vectors to carry out the extended Galois field operation without carrying out a bit shift operation in the vectors; and wherein the number of bits as elements constituting each of the vectors is equal to the data unit, and the operational expression is an operational expression for generating a redundant code data string or an operational expression for data string restoration.

In the present invention, an exclusive OR operation is executed in data units that are composed of a plurality of bits rather than in bit units, whereby a Galois field operation can be executed with carrying out neither bit shift operations nor data mask operations. As a result, a Galois field operation can be carried out at high speed because bit shift instructions or data mask instructions are not necessary even when operations are executed using, for example, a general-purpose CPU.

The above and other objects, features, and advantages of the present invention will become apparent from the following description based on the accompanying drawings which illustrate exemplary embodiments of the present invention.

BRIEF DESCRIPTION OF THE DRAWINGS

FIG. 1 is a view describing the arithmetic process for generating redundant code strings using a $2^4$-extended Galois field ($GF(2^4)$) in the related art;

FIG. 8 is a view explaining an example of an arithmetic process for restoring data in an exemplary embodiment;

DETAILED DESCRIPTION OF THE EXEMPLARY EMBODIMENTS

Figure 2:
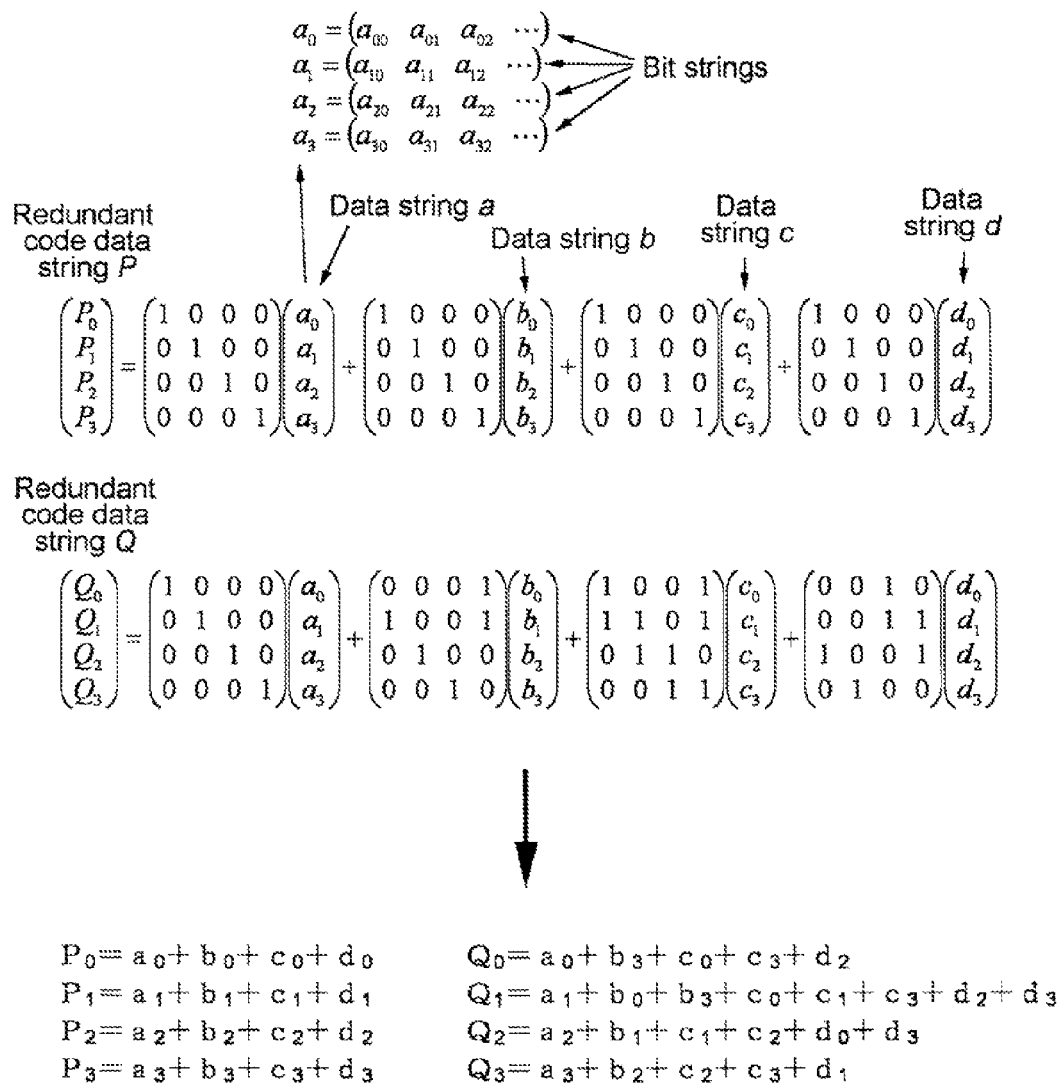
FIG. 2 is a view describing the arithmetic process for generating redundant code strings in an exemplary embodiment of the present invention.

The generation of redundant code in an exemplary embodiment is first described using FIG. 2. The following explanation regards a case in which redundant code data strings P and Q are generated from data by means of an arithmetic operation on an extended Galois field $GF(2^4)$ with a mind to application to a RAID 6 system having four disk drives for data storage, one disk drive for P-code string storage, and one disk drive for Q-code sting storage. The data that here serve as the object of redundant code data string generation are divided into four data strings a, b, c and d that each correspond to a respective disk drive for data storage. When the number of disk drives for data storage is greater than four, the number of data string divisions should be correspondingly increased.

Data strings a to d are all further divided into four bit strings to correspond with the performance of a Galois field $GF(2^4)$ arithmetic operation. More specifically, data string a is divided into bit strings $a_0$, $a_1$, $a_2$, and $a_3$; and data string b is divided into bit strings $b_0$, $b_1$, $b_2$, and $b_3$. The same is true for data strings c and d. Bit string $a_0$ is made up from bits $a_{00}$, $a_{01}$, $a_{02}$, $a_{03}$, $a_{04}$, and bit string $a_1$ is made up from $a_{10}$, $a_{11}$, $a_{12}$, $a_{13}$, $a_{14}$, . . . . The same holds true for the other bit strings. The Galois field used here in the generation of redundant code data strings is $GF(2^4)$, but the Galois field used in the generation of redundant code data strings is not limited to this form, and a Galois field such as $GF(2^{16})$ or $GF(2^8)$ can also be used. The number of bit strings into which data strings are divided depends on the size of the Galois field that is used in the Galois field operations, and for example, when Galois field operations are executed out in $GF(2^8)$, one data string is divided into eight bit strings.

In the present exemplary embodiment, the bit width that is suitable for an exclusive OR operation using a CPU is referred to as a data unit. A data unit is composed of a plurality of bits, and for example, is set according to the number of bits that is the unit of data processing of the arithmetic-logic unit arranged in the CPU. Here, we will use value j as the data unit. Current CPUs generally deal with data in 32-bit or 64-bit units, but even 32-bit or 64-bit CPUs are configured to be able to carry out data processing with an 8-bit (i.e., one byte) unit or a 16-bit unit as one word, and the number of bits of a data unit, i.e., value j, is, for example, 8, 16, 32, or 64. The number of bits of a data unit can also be increased.

Redundant code data string P to be generated is similarly made up from the four bit strings $P_0$, $P_1$, $P_2$ and $P_3$; and redundant code data string Q is similarly made up from the four bit strings $Q_0$, $Q_1$, $Q_2$, and $Q_3$. Bit string $P_0$ is made up from bits $P_{00}$, $P_{01}$, $P_{02}$, $P_{03}$, $P_{04}$, . . . ; and bit string $Q_1$ is made up from bits $Q_{10}$, $Q_{11}$, $Q_{12}$, $Q_{13}$, $Q_{14}$, . . . .

In the present exemplary embodiment, j pieces of bits are extracted from each of the bit strings of the original data and a Galois field operation is carried out on the extracted bits to determine to the values of j pieces of bits in each bit string on the redundant code data side. As described above, value j represents the data unit. As a result, each of bit strings $a_0$, $a_1$, $b_0$, . . . , $d_3$, $P_0$, $P_1$, . . . , $Q_3$ can all be thought of as a row vector having j pieces of elements. Each element of these row vectors is a one-bit value and is represented by "0" or "1."

By considering vectors each corresponding to a bit string, a Galois field operation is then executed by carrying out the matrix operation shown in FIG. 2, and redundant code data strings P and Q are determined by every j bits. For example, by means of the exclusive OR operation ("+") of the bit strings $a_0, b_3, c_0, c_3, d_2$, that are all represented as vectors, bit string $Q_0$ that is represented as a vector is represented as:

$$Q_0 = a_0 + b_3 + c_0 + c_3 + d_2 \qquad (3).$$

Figure 3:
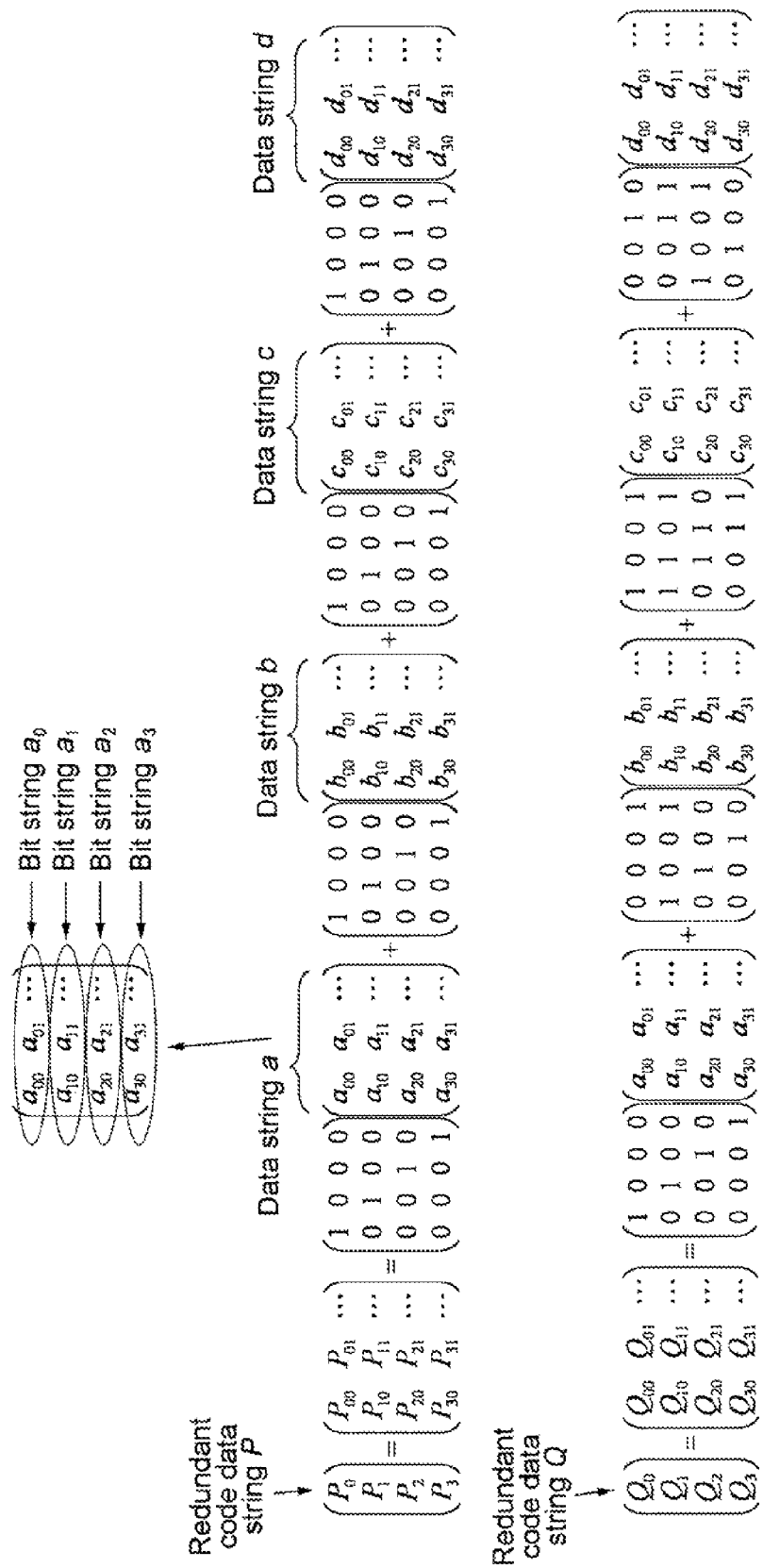
FIG. 3 is a view illustrating the principles of the arithmetic process shown in FIG. 2.

The mutual exclusive OR operation of vectors means the execution of the exclusive OR operation between corresponding elements among vectors for each vector element. By repeatedly extracting j pieces of bits from each bit string and executing the above-described exclusive OR operation until no unprocessed bits remain in the bit strings, redundant code data strings P and Q that correspond to all original data can be obtained. FIG. 3 shows the expansion of a bit string to bits and the computation of a redundant code data string in this exemplary embodiment.

As can be seen by referring to FIG. 2 and FIG. 3, in the present exemplary embodiment, bit strings extracted from data strings are treated as vectors without alteration, and a Galois field operation can be executed to generate redundant code data strings P and Q by merely carrying out the exclusive OR operation between the vectors without carrying out bit shift or data mask operations for bits extracted from the bit strings.

Figures 4A, 4B:
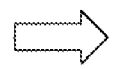
FIG. 4A is a view showing the generation of a redundant code by the arithmetic process shown in FIG. 1.
FIG. 4B is a view showing the generation of a redundant code by the arithmetic process shown in FIG. 2.

FIG. 4A and FIG. 4B show a side-by-side comparison of the generation of a redundant code data string in the related art shown in FIG. 1 and the generation of a redundant code data string in the present exemplary embodiment.

In the related art shown in FIG. 1, a Galois field operation is normally carried out in bit units. When the Galois field operation is carried out in bit units in a CPU, a bit shift operation of data or a mask operation for data is required as shown in FIG. 4A.

In contrast, according to the present exemplary embodiment, a Galois field operation can be carried out by an exclusive OR operation as a vector operation between bit strings represented as vectors as shown in FIG. 4B. Here, there is no need to carry out operations such as bit shifts or data masking. Thus, by eliminating the need for executing bit shift instructions or data mask instructions, the Galois field operation can be carried out at high speed when computing in a CPU. Even without dedicated or special hardware for executing a Galois field operation, the Galois field operation can be carried out if hardware capable of an exclusive OR operation is incorporated. Still further, in the process of the above-described operation, the bit string from which j pieces of bits are extracted can be selected by controlling the addresses for the memory in which these bit strings are stored. Typically, the bit width of a data bus for a memory is set to, for example, the same bit width of the arithmetic-logic processing unit in the CPU, and the bit width of the data unit, i.e. value j, is set to the same bit width as the arithmetic-logic processing unit in the CPU, and as a result, carrying out one memory access for each bit string enables the extraction of the data required for the computation of a j-bits portion of a bit string in a redundant code data string, and for this reason as well, the present exemplary embodiment can realize a Galois field operation at higher speed.

Even though redundant code data strings are generated based on the same data, depending on whether a Galois field operation is carried out in bit units or a Galois field operation is carried out by vector operations, the redundant code data strings obtained by the related art and the redundant code data strings obtained by the present exemplary embodiment differ when compared as data strings. However, as will be explained hereinbelow, the redundant code data strings obtained by the present exemplary embodiment can be used in the restoration of original data strings similarly to the related art.

The explanation above is for a case in which unit matrix I is placed in correspondence with each of data strings a to d to generate redundant code data string P and matrices I, T, $T^4$ and $T^2$ are placed in correspondence with each of data strings a, b, c and d to generate redundant code data string Q, but as disclosed in James S. Plank [1] and James S. Plank and Ying Ding [2], the operational expression for generating redundant code strings P and Q is not limited to the expression described here. For example, the generation of redundant code data string P may be the same as described here, while the generation of redundant code data string Q may be realized by placing matrices I, T, $T^2$ and $T^{14}$ in correspondence with data strings a, b, c and d.

Figure 5:
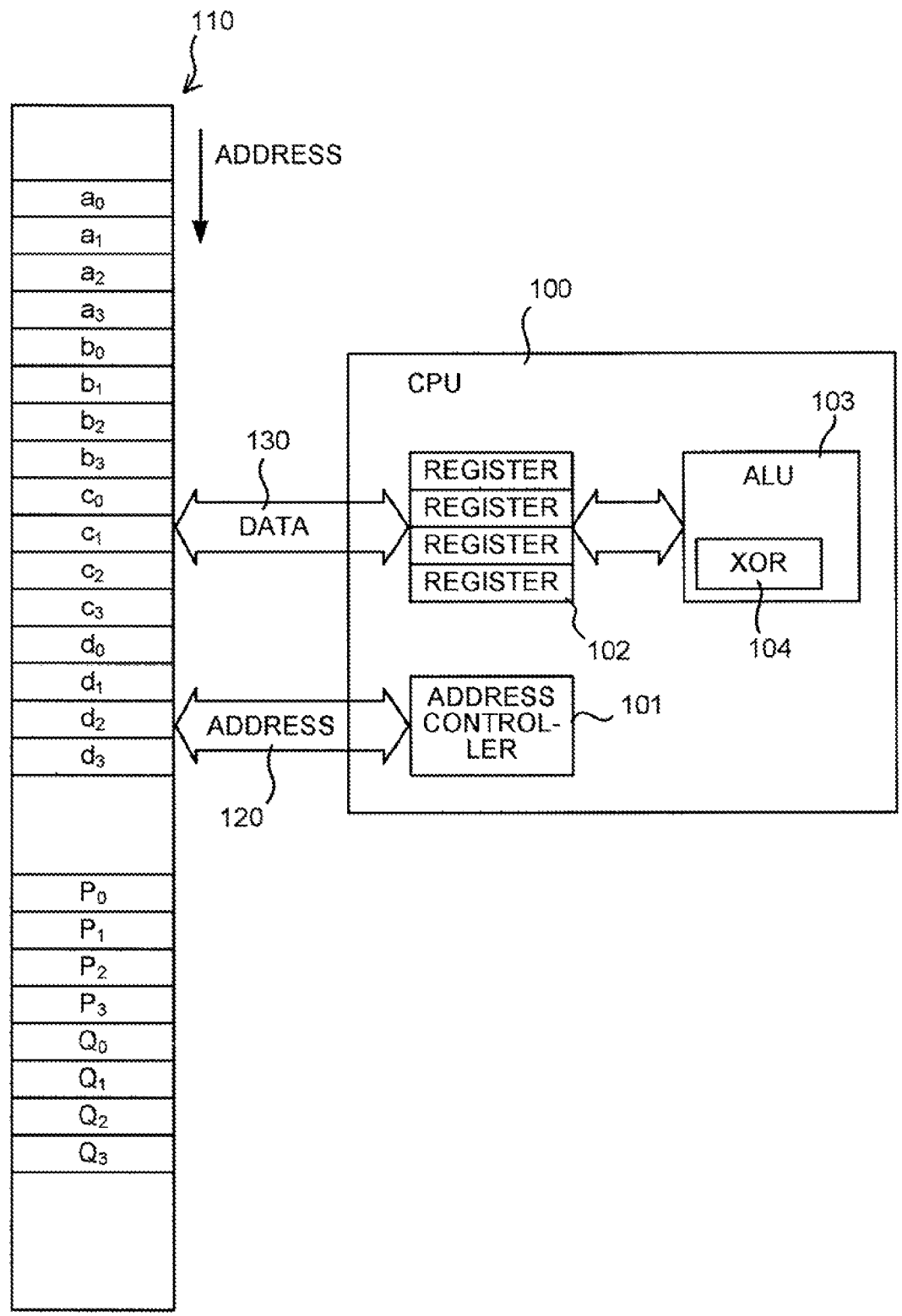
FIG. 5 is a block diagram showing an example of the basic hardware configuration for executing the arithmetic process of generating a redundant code data string shown in FIG. 2.

FIG. 5 is a block diagram showing an example of the configuration of the basic hardware for executing the arithmetic process of generating redundant code data strings in the present exemplary embodiment.

The hardware configuration is provided with CPU 100 that functions as an arithmetic device, memory 110, address bus 120, and data bus 130. CPU 100 is equipped with at least: address controller 101 for supplying address data to address bus 120, a plurality of registers 102 connected to data bus 130, and arithmetic-logic unit (ALU) 103 for executing the four basic operations of arithmetic or logical operations upon data in registers 102. Exclusive OR arithmetic circuit (XOR) 104 for executing exclusive OR calculations is provided in ALU 103.

The bit width of data bus 130 matches the bits of one word, i.e., the bit width that is the unit of arithmetic processing in CPU 100, and the bit width of CPU 100 is used as the data unit in Galois field operations.

Memory 110 is connected to address bus 120 and data bus 130, memory addresses are designated by address data on address bus 120, and data can be read and written in the bit width units of data bus 130. The memory area of memory 110 is divided into areas for storing each of data strings a, b, c and d and redundant code data strings P and Q, and the memory areas for each data string is finely divided into memory areas of each of the above-described bit strings. Of the memory areas of memory 110 in the figure, the area noted as $a_0$ is the area in which bit string $a_0$ is stored.

In this hardware configuration, designating an address enables j bits of a bit string from memory 120 to be taken into any register 102 of CPU 100, j representing the data unit. In order to carry out the above-described series of exclusive OR operations upon bit strings that are stored in memory 120, while address controller 101 sequentially designates addresses, bit strings are taken into each register 102, and exclusive OR arithmetic circuit 104 executes exclusive OR operations upon the bit strings stored in respective registers 102 to generate bit strings that make up redundant code data strings. In other words, address controller 101 implements address control such that bit strings are extracted from memory 110 and the exclusive OR operations based on the above-described operational expression are carried out. The bit strings that make up redundant code data strings are written to predetermined memory areas of memory 110 by way of registers 102 and data bus 130. In this case, bit shift and data mask operations are not carried out in CPU 100 and redundant code data strings can therefore be generated at high speed.

Figure 6:
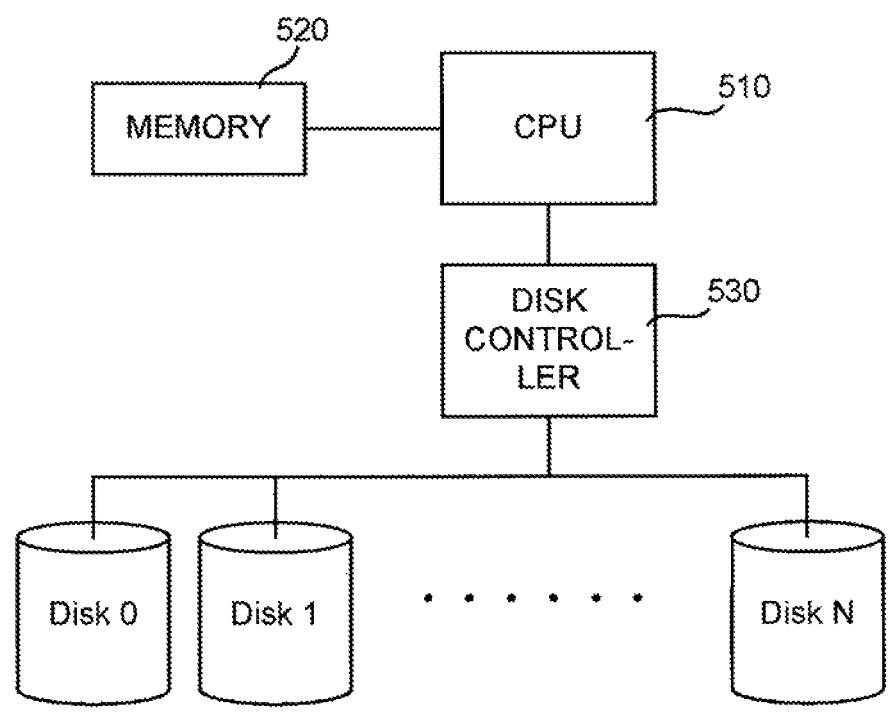
FIG. 6 is a block diagram showing an example of the configuration of the RAID system in an exemplary embodiment.

An example of the configuration of a RAID system in which the above-described redundant code generation method is applied is next described using FIG. 6.

The RAID system is provided with N+1 pieces of disk drives Disk 0 to Disk N that are each data recording media, where N is an integer of at least 3, and these disk drives are connected to CPU 510 by way of disk controller 530. CPU 510 is a component for both carrying out a Galois field operation to generate redundant code by the above-described method and carrying out a restoration process of damaged data when a fault occurs in a disk drive. Memory 520 is connected to CPU 510. Memory 520 is used as a buffer when the Galois field operation is being carried out in CPU 510. In the following explanation, redundant code data strings are referred to as parity data in accordance with the typical terminology in a RAID system.

In the RAID system, data and redundant code data generated from the data are written to disk drives. Disk controller 530 is a control apparatus for carrying out the operations of each disk drive, such as writing data to a disk drive or reading data from a disk drive.

Figure 7:
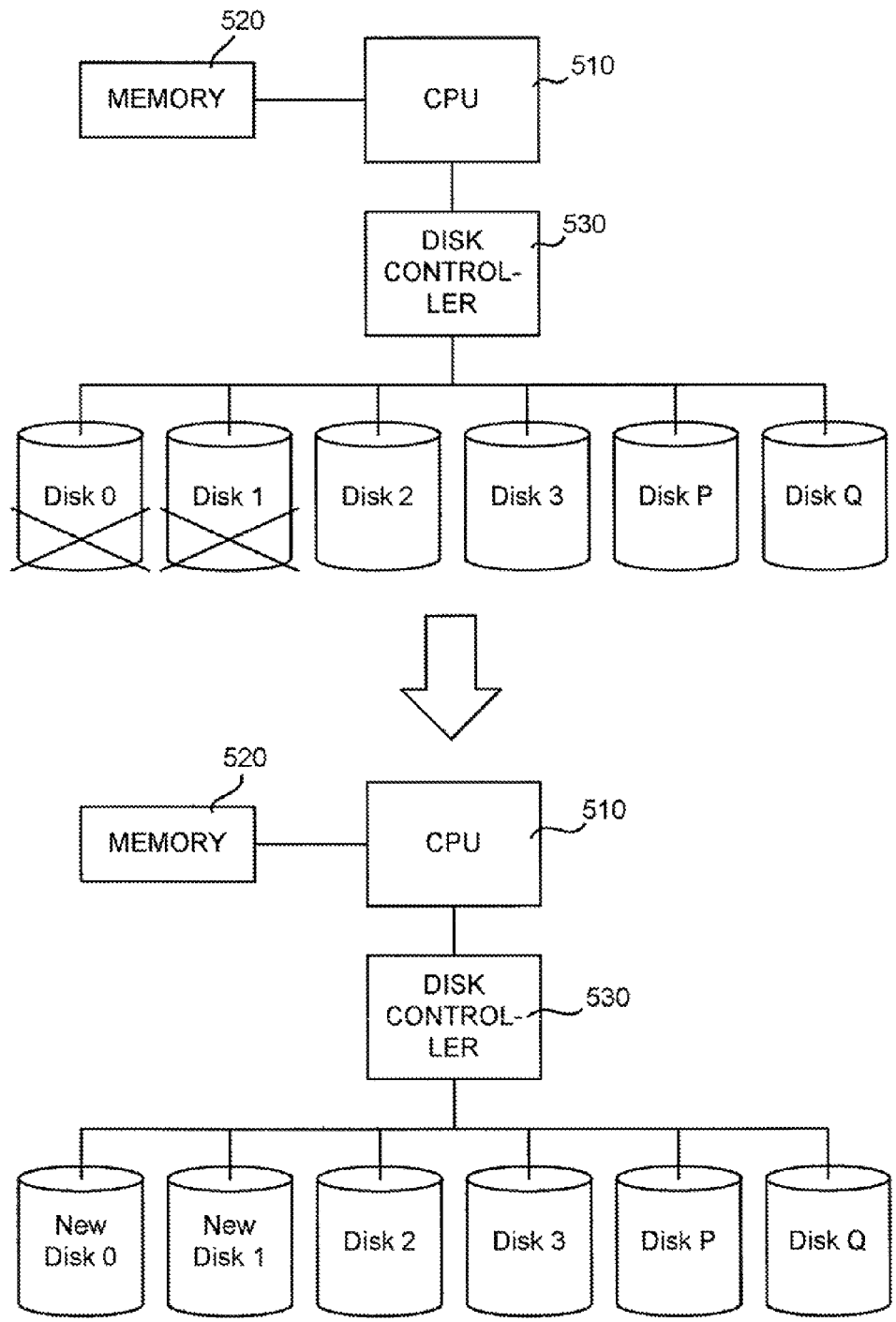
FIG. 7 is a view describing the operation of the RAID system shown in FIG. 6.

The operations of the RAID system shown in FIG. 6 are next described using FIG. 7. It is here assumed that six disk drives, i.e., Disk 0 to Disk 3, Disk P and Disk Q, are provided, that Disk 0 to Disk 3 are disk drives for storing data in a distributed manner, and that Disk P and Disk Q are parity disk drives, i.e., redundancy disk drives, for storing parity data based on redundant code (P-code strings and Q-code strings).

In the interest of facilitating understanding of the operations, a case is assumed in which data of one byte (=8 bits) are written to Disk 0 to Disk 3. The matrix operational expression shown in FIG. 2 is used as the operational expression for parity data generation. Normally, CPUs deal with data in 32-bit or 64-bit units, and matching the operation data unit to the bit width of the arithmetic processing unit of the CPU allows operations to be more efficiently carried out, but in the case of data of 4 bytes (32 bits), the number of elements becomes extremely great and the explanation becomes excessively complex, and explanation here will therefore regard an example in which the data unit is one byte, that is, j=8. The following example can be readily extended to cases in which the data unit of operations is 32 bits (=4 bytes) or 64 bits (=8 bytes). In the following explanation, numerical values beginning with "0x" are data of each byte represented in hexadecimal notation by the two characters following "0x." It is here assumed that data are distributed and arranged in disks Disk 0 to Disk 3 as shown below:

Disk 0: the four bytes of data 0x64, 0x6F, 0x40 and 0x48 (assumed to be $a_0$, $a_1$, $a_2$ and $a_3$, respectively).

Disk 1: the four bytes of data 0x15, 0x02, 0x0F and 0xD3 (assumed to be $b_0$, $b_1$, $b_2$ and $b_3$, respectively).

Disk 2: the four bytes of data 0xE6, 0x63, 0x2C and 0x08 (assumed to be $c_0$, $c_1$, $c_2$ and $c_3$, respectively).

Disk 3: the four bytes of data 0x00, 0x37, 0x9B and 0xAC (assumed to be $d_0$, $d_1$, $d_2$ and $d_3$, respectively).

The operations during generation of the parity data are as next described.

Memory 520 is used as a buffer during disk writing and the Galois field operation for calculation of parity data of the above-described data. CPU 510 reads data from memory 520, and carries out parity generation. At this time, the parity generated from the above-described data is computed as follows in accordance with the calculation method shown in FIG. 2. Here, "+" represents exclusive OR operation.

$$P_0 = 0x64 + 0x15 + 0xE6 + 0x00$$
$$= 0x97,$$
$$P_1 = 0x6F + 0x02 + 0x63 + 0x37$$
$$= 0x39,$$
$$P_2 = 0x40 + 0x0F + 0x2C + 0x9B$$
$$= 0xF8,$$
$$P_3 = 0x48 + 0xD3 + 0x08 + 0xAC$$
$$= 0x3F,$$
$$Q_0 = 0x64 + 0xD3 + 0xE6 + 0x08 + 0x9B$$
$$= 0xC2,$$
$$Q_1 = 0x6F + 0x15 + 0xD3 + 0xE6 + 0x63 + 0x08 + 0x9B + 0xAC$$
$$= 0x13,$$
$$Q_2 = 0x40 + 0x02 + 0x63 + 0x2C + 0x00 + 0xAC$$
$$= 0xA1,$$
$$Q_3 = 0x48 + 0x0F + 0x2C + 0x08 + 0x37$$
$$= 0x54.$$

CPU 510 first stores the calculated parity in memory 520, and then stores all data in each disk drive through disk controller 530. At this time, the redundant code data string P made up from bit strings $P_0$ to $P_3$ is written to Disk P, and the redundant code data string Q made up from bit strings $Q_0$ to $Q_3$ is written to Disk Q. In the interest of simplifying the explanation here, the disk drives are fixed as the parity disk drives, but the parity disk drives need not be fixed.

As can be seen from the foregoing explanation, parity data can be generated based on original data, and data including the parity data are distributed and arranged on each disk drive.

Next, referring to FIG. 7, assuming a case in which data are stored in each disk drive as described hereinabove and two of the six disk drives fail, the restoration of the data from the remaining disk drives is considered. Here, it is assumed that Disk 0 and Disk 1 have failed, and that data are to be restored from the remaining four disk drives, that is, Disk 2, Disk 3, Disk P and Disk Q.

In a state in which Disk 0 and Disk 1 have failed, CPU 510 reads data from Disk 2, Disk 3, Disk P and Disk Q by way of disk controller 530 and stores the data in memory 520. CPU 510 next reads data from memory 520, carries out a Galois field operation, restores data, and stores the data following restoration in memory 520. The restoration pattern when the matrix operational expression shown in FIG. 1 is used is represented by TABLE 1. TABLE 1 is a Galois field multiplication table showing, when any one or two disk drives fail in a configuration having six disk drives shown in FIG. 7, how the data of the disk drives that have failed are restored from the data of the other disk drives. In other words, TABLE 1 shows an example of a Galois field multiplication table used in the restoration of data of disk drives that have failed. A state in which no disk drives have failed is indicated by the "none" column in the table. It will be obvious that data that are stored in normal disk drives can be read as is from the disk drive. Multiplication in this table is Galois field multiplication, and the coefficient of this multiplication is the value when the root of a primitive polynomial is represented as a vector at an exponent of the power of a primitive root.

TABLE 1

| Failed disk drive(s) | Reading data of Disk 0 | Reading data of Disk 1 | Reading data of Disk 2 | Reading data of Disk 3 | Reading data of Disk P | Reading data of Disk Q |
|---|---|---|---|---|---|---|
| none | $D_0$ | $D_1$ | $D_2$ | $D_3$ | P | Q |
| Disk P | $D_0$ | $D_1$ | $D_2$ | $D_3$ | $D_0 + D_1 + D_2 + D_3$ | Q |
| Disk Q | $D_0$ | $D_1$ | $D_2$ | $D_3$ | P | $D_0 + 2D_1 + 3D_2 + 4D_3$ |
| Disk 0 | $D_1 + D_2 + D_3 + P$ | $D_1$ | $D_2$ | $D_3$ | P | Q |
| Disk 1 | $D_0$ | $D_0 + D_2 + D_3 + P$ | $D_2$ | $D_3$ | P | Q |
| Disk 2 | $D_0$ | $D_1$ | $D_0 + D_1 + D_3 + P$ | $D_3$ | P | Q |
| Disk 3 | $D_0$ | $D_1$ | $D_2$ | $D_0 + D_1 + D_2 + P$ | P | Q |
| Disk P & Disk Q | $D_0$ | $D_1$ | $D_2$ | $D_3$ | $D_0 + D_1 + D_2 + D_3$ | $D_0 + 2D_1 + 3D_2 + 4D_3$ |
| Disk 0 & Disk Q | $D_1 + D_2 + D_3 + P$ | $D_1$ | $D_2$ | $D_3$ | P | $3D_1 + 2D_2 + 5D_3 + P$ |
| Disk 1 & Disk Q | $D_0$ | $D_0 + D_2 + D_3 + P$ | $D_2$ | $D_3$ | P | $3D_0 + D_2 + 6D_3 + 2P$ |
| Disk 2 & Disk Q | $D_0$ | $D_1$ | $D_0 + D_1 + D_3 + P$ | $D_3$ | P | $2D_0 + D_1 + 7D_2 + 3P$ |
| Disk 3 & Disk Q | $D_0$ | $D_1$ | $D_2$ | $D_0 + D_1 + D_2 + P$ | P | $5D_0 + 6D_1 + 7D_2 + 4P$ |
| Disk 0 & Disk P | $2D_1 + 3D_2 + 4D_3 + Q$ | $D_1$ | $D_2$ | $D_3$ | $3D_1 + 2D_2 + 5D_3 + Q$ | Q |
| Disk 1 & Disk P | $D_0$ | $9D_0 + 8D_2 + 2D_3 + Q$ | $D_2$ | $D_3$ | $8D_0 + 9D_2 + 3D_3 + 9Q$ | Q |
| Disk 2 & Disk P | $D_0$ | $D_1$ | $14D_0 + 15D_1 + 13D_3 + 14Q$ | $D_3$ | $15D_0 + 14D_1 + 12D_3 + 14Q$ | Q |
| Disk 3 & Disk P | $D_0$ | $D_1$ | $D_2$ | $13D_0 + 9D_1 + 4D_2 + 13Q$ | $12D_0 + 8D_1 + 5D_2 + 13Q$ | Q |
| Disk 0 & Disk 1 | $14D_2 + 2D_3 + 15P + 14Q$ | $15D_2 + 3D_3 + 14P + 14Q$ | $D_2$ | $D_3$ | P | Q |
| Disk 0 & Disk 2 | $9D_1 + 10D_3 + 8P + 9Q$ | $D_1$ | $8D_1 + 11D_3 + 9P + 9Q$ | $D_3$ | P | Q |
| Disk 0 & Disk 3 | $15D_1 + 4D_2 + 10P + 11Q$ | $D_1$ | $D_2$ | $14D_1 + 5D_2 + 11P + 11Q$ | P | Q |
| Disk 1 & Disk 2 | $D_0$ | $2D_0 + 7D_3 + 3P + Q$ | $3D_0 + 6D_3 + 2P + Q$ | $D_3$ | P | Q |
| Disk 1 & Disk 3 | $D_0$ | $8D_0 + 6D_2 + 15P + 7Q$ | $D_2$ | $9D_0 + 7D_2 + 14P + 7Q$ | P | Q |
| Disk 2 & Disk 3 | $D_0$ | $D_1$ | $13D_0 + 7D_1 + 11P + 6Q$ | $12D_0 + 6D_1 + 10P + 6Q$ | P | Q |

As can be seen by referring to the Galois field multiplication table of TABLE 1, when Disk 0 and Disk 1 have failed, the restoration matrix used for restoring the data of Disk 0 and Disk 1 using the other disk drives is shown in FIG. 8. In FIG. 8, sector string c is the data string that is read from Disk 2, and because an operation in $GF(2^4)$ is here presupposed, this sector string c is made up from bit strings $c_0$, $c_1$, $c_2$ and $c_3$, as when generating a redundant code data string. Sector strings d, P and Q are also data strings read from Disk 3, Disk P and Disk Q, respectively, and all of these sector strings are made up from four bit strings. These bit strings are treated as row vectors each having j pieces of elements, j being the above-described data unit. Then, by carrying out operations in accordance with the expression shown in FIG. 8, data string a made up from bit strings $a_0$, $a_1$, $a_2$ and $a_3$ and data string h made up from bit strings $b_0$, $b_1$, $b_2$ and $b_3$ are restored, whereby the restoration of the data stored in Disk 0 and Disk 1 is achieved. If the restoration matrix of FIG. 8 is applied to this case, the data that were stored in failed disk drives Disk 0 and Disk 1 are restored as shown by the following formulas:

$a_0 = c_1 + c_2 + c_3 + d_3 + P_0 + P_1 + P_2 + P_3 + Q_1 + Q_2 + Q_3$, $a_1 = c_0 + c_1 + d_0 + d_3 + P_0 + Q_0 + Q_1$, $a_2 = c_0 + c_1 + c_2 + d_1 + P_0 + P_1 + Q_0 + Q_1 + Q_2$, $a_3 = c_0 + c_1 + c_2 + c_3 + d_2 + P_0 + P_1 + P_2 + Q_0 Q_1 + Q_2 + Q_3$, $b_0 = c_0 + c_1 + c_2 + c_3 + d_0 + d_3 + P_1 + P_2 + P_3 Q_1 + Q_2 + Q_2$, $b_1 = c_0 + d_0 + d_1 + d_3 + P_0 + P_1 + Q_0 + Q_1$, $b_2 = c_0 + c_1 + d_1 + d_2 + P_0 + P_1 + P_2 + Q_0 + Q_1 + Q_2$, $b_3 = c_0 + c_1 + c_2 + d_2 + d_3 + P_0 + P_1 + P_2 + P_3 + Q_0 + Q_1 + Q_2 + Q_3$.

Substituting actual numerical values in these restoration formulas produces the following:

$$a_0 = 0x63 + 0x2C + 0x08 + 0xAC + 0x97 + 0x39 + 0xF8 + 0x3F + 0x13 + 0xA1 + 0x54$$
$$= 0x64,$$

$$a_1 = 0xE6 + 0x63 + 0x00 + 0xAC + 0x97 + 0xC2 + 0x13$$
$$= 0x6F,$$

$$a_2 = 0xE6 + 0x63 + 0x2C + 0x37 + 0x97 + 0x39 + 0xC2 + 0x13 + 0xA1$$
$$= 0x40,$$

-continued $$a_3 = 0xE6 + 0x63 + 0x2C + 0x08 + 0x9B + 0x97 + 0x39 +$$
$$0xF8 + 0xC2 + 0x13 + 0xA1 + 0x54$$
$$= 0x48,$$
$$b_0 = 0xE6 + 0x63 + 0x2C + 0x08 + 0x00 + 0xAC + 0x39 +$$
$$0xF8 + 0x3F + 0x13 + 0xA1 + 0x54$$
$$= 0x15,$$
$$b_1 = 0xE6 + 0x00 + 0x37 + 0xAC + 0x97 + 0x39 + 0xC2 +$$
$$0x13$$
$$= 0x02,$$
$$b_2 = 0xE6 + 0x63 + 0x37 + 0x9B + 0x97 + 0x39 + 0xF8 +$$
$$0xC2 + 0x13 + 0xA1$$
$$= 0x0F,$$
$$b_3 = 0xE6 + 0x63 + 0x2C + 0x9B + 0xAC + 0x97 + 0x39 +$$
$$0xF8 + 0x3F + 0xC2 + 0x13 + 0xA1 + 0x54$$
$$= 0xD3.$$

Based on the foregoing formulas, it is demonstrated that when Disk 0 and Disk 1 have failed, the data that was stored on the failed disk drives (bit strings $a_0$ to $a_3$ and $b_0$ to $b_3$) can be restored by using the remaining data and the parity realized by redundant code generation based on the present exemplary embodiment. Although details are not given here, using the parity data generated by means of the redundant code generation method according to the present exemplary embodiment to execute operations similar to those described above enables the restoration of data regardless of which disk drives fail as long as no more than two disk drives fail.

The operational expression shown in FIG. 8 is equivalent to the operational expression shown in FIG. 2 with the exception of the difference of the matrix that acts upon each of the bit strings as vectors. Accordingly, it can be seen that when data strings a and b are restored by means of a Galois field operation based on FIG. 8, the restoration of data strings can be carried out by only exclusive OR without carrying out bit shift or data mask operations. The arithmetic process for restoring data strings can be executed using, for example, hardware of the configuration shown in FIG. 5.

When disk drives Disk 0 and Disk 1 in which failure has occurred are each exchanged with normal disk drives New Disk 0 and New Disk 1, respectively, as shown in the lower section of FIG. 7, disk controller 530 writes the restored data to New Disk 0 and New Disk 1 after the exchange. This series of operations completes the restoration of data that were lost due to the failure.

Although data restoration operations upon the failure of disk drives Disk 0 and Disk 1 have been described hereinabove, it will be clear from the Galois field multiplication table shown in TABLE 1 that in the event of failure of any one or two disk drives in the RAID system having six disk drives shown in FIG. 7, the implementation of processes equivalent to those here described enables the restoration of data that were stored in the disk drives that failed.

Figure 9:
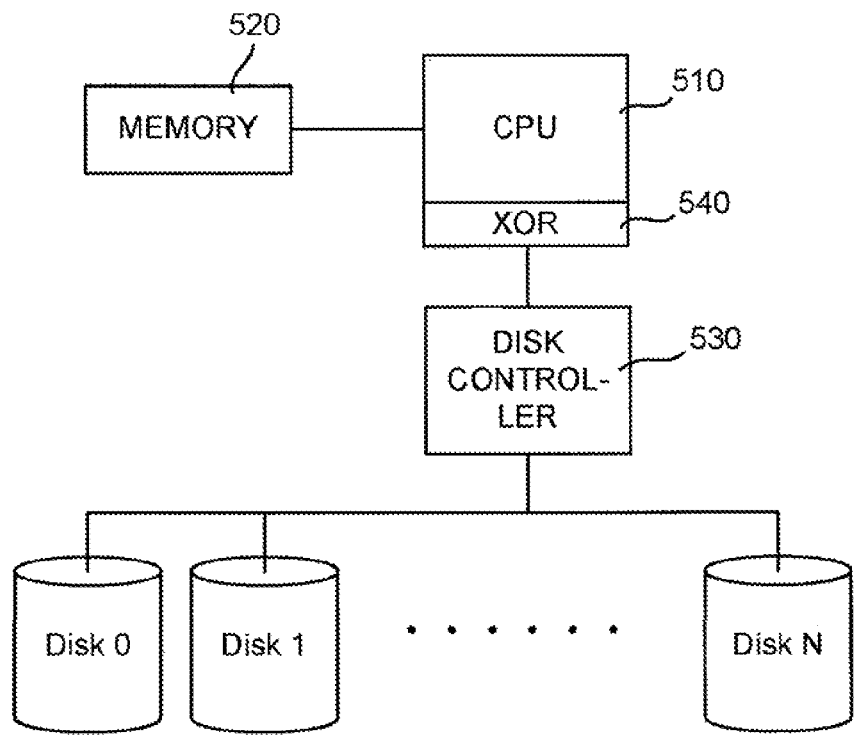
FIG. 9 is a block diagram showing another example of a configuration of the RAID system.

FIG. 9 shows another example of the configuration of a RAID system. In the system shown in FIG. 9, exclusive OR arithmetic circuit (XOR) 540 is incorporated inside CPU 510 separate from an ordinary ALU (arithmetic-logic unit). When calculating redundant code data strings or restoring data strings, exclusive OR operations must be carried out many times, but the provision of exclusive OR arithmetic circuit 540 separate from the ALU in CPU 510 allows the exclusive OR operations for Galois field operations in CPU 510 to be carried out separately from the operations of other processes in CPU 510, whereby the Galois field operations can be executed more rapidly.

Figure 10:
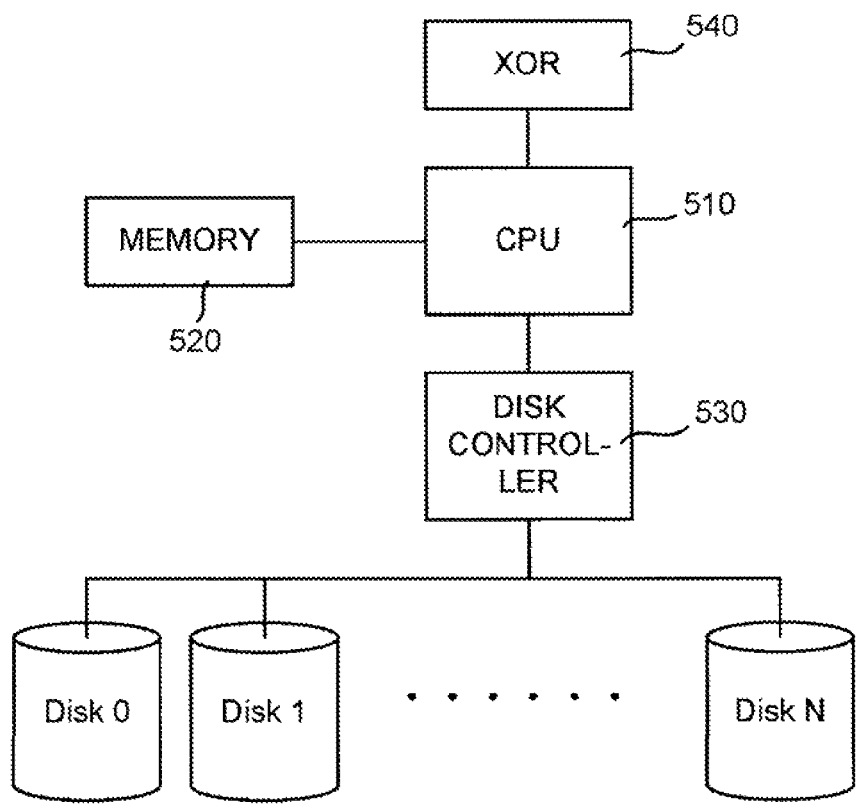
FIG. 10 is a block diagram showing yet another example of the configuration of the RAID system.

FIG. 10 shows yet another example of the configuration of a RAID system. In the system shown in FIG. 10, exclusive OR arithmetic circuit (XOR) 540 is arranged outside the CPU, i.e., separate from the CPU. In this configuration, the values of exclusive OR operations are computed by an outside arithmetic circuit rather than the CPU, whereby the Galois field operations can be carried out without relation to the operation of the CPU, and the Galois field operations can be executed at even greater speed. Further, in this configuration, bit strings used in the Galois field operations can be directly supplied from memory 520 to exclusive OR arithmetic circuit 540 using, for example, a DMA (Direct Memory Access) method.

It will be apparent that other variations and modifications may be made to the above described exemplary embodiments and functionality, with the attainment of some or all of their advantages. It is an object of the appended claims to cover all such variations and modifications as come within the true spirit and scope of the invention.

What is claimed is:

1. A redundant code generation method for generating a redundant code data string by an extended Galois field operation from original data, comprising:
dividing said original data into a plurality of data strings;
dividing each of said data strings into a number of bit strings that accords with said extended Galois field operation;
storing each bit string generated by the division in a different memory area of a memory; and
executing an exclusive OR operation among vectors, which are extracted from the respective bit strings stored in said memory, according to an operational expression to compute bit strings that make up said redundant code data string without carrying out a bit shift operation within said vectors, a predetermined plural number of bits being taken as a data unit, the number of bits as elements constituting each of said vectors being equal to said data unit, said operational expression including a companion matrix of a primitive polynomial of said extended Galois field and defining the generation of said redundant code data string.

2. The method as set forth in claim 1, wherein said exclusive OR operation is executed by a CPU, and said data unit matches a bit width of operations on said CPU.

3. The method as set forth in claim 1, wherein said exclusive OR operation is executed by an exclusive OR arithmetic circuit.

4. A redundant code generation device for generating a redundant code data string by means of an extended Galois field operation from original data, comprising:
an arithmetic device including at least an exclusive OR arithmetic circuit;
a memory; and
an address bus and data bus connecting said arithmetic device and said memory;
wherein said original data are divided into a plurality of data strings; each of said data strings is divided into a number of bit strings that accords with the extended Galois field operation; and said memory includes a plurality of memory areas for storing each of said bit strings generated by the division, wherein said arithmetic device, taking a predetermined plural number of bits as a data unit, extracts vectors from the respective bit strings stored in said memory under address control that accords with an operational expression, executes an exclusive OR operation among said vectors to compute bit strings that make up said redundant code data string without carrying out a bit shift operation in said vectors, and stores the computed bit strings in corresponding memory areas in said memory, and wherein the number of bits as elements constituting each of said vectors is equal to said data unit, and the operational expression includes a companion matrix of a primitive polynomial of said extended Galois field and defines the generation of said redundant code data string.

5. The device as set forth in claim 4, wherein said arithmetic device comprises a CPU that includes said exclusive OR arithmetic circuit and an address controller executing said address control upon said address bus.

6. The device as set forth in claim 5, wherein said data unit matches a bit width of operations on said CPU.

7. A data restoration method for, when original data have been divided into a plurality of data strings and a redundant code data string has been generated by means of an extended Galois field operation from said original data, restoring a data string, which has become faulty among said data strings, based on normal data strings and said redundant code data string to generate a restored data string, said data restoration method comprising:

dividing each of said normal data strings and said redundant code data string into a number of bit strings that accords with said extended Galois field operation;

storing each of the bit strings generated by the division in a different memory area of a memory; and executing an exclusive OR operation among vectors, which are extracted from the respective bit strings stored in said memory, according to an operational expression to compute bit strings that make up said restored data string without carrying out a bit shift operation in said vectors, a predetermined plural number of bits being taken as a data unit, the number of bits as elements constituting each of said vectors being equal to said data unit, said operational expression including a companion matrix of a primitive polynomial of said extended Galois field and defining the restoration of data strings.

8. The method as set forth in claim 7, wherein said exclusive OR operation is executed by a CPU, and said data unit matches a bit width of operation in said CPU.

9. The method as set forth in claim 7, wherein said exclusive OR operation is executed by an exclusive OR arithmetic circuit.

10. A data restoration device for, when original data have been divided into a plurality of data strings and a redundant code data string has been generated by means of an extended Galois field operation from said original data, restoring a data string, which has become faulty among said data strings, based on normal data strings and said redundant code data string to generate a restored data string, said data restoration device comprising:

an arithmetic device including at least an exclusive OR arithmetic circuit;

a memory; and an address bus and data bus connecting said arithmetic device and said memory;

wherein each of said normal data strings and said redundant code data string is divided into a number of bit strings that accords with said extended Galois field operation; said memory includes a plurality of memory areas for storing each of the bit strings generated by the division, wherein said arithmetic device, taking a predetermined plural number of bits as a data unit, extracts vectors from the respective bit strings stored in said memory under address control that accords with an operational expression, executes an exclusive OR operation among said vectors to compute bit strings that make up said restored data string without carrying out a bit shift operation in said vectors, and stores the computed bit strings in corresponding memory areas in said memory, and wherein the number of bits as elements constituting each of said vectors is equal to said data unit, and the operational expression includes a companion matrix of a primitive polynomial of said extended Galois field and defines the restoration of data strings.

11. The device as set forth in claim 10, wherein said arithmetic device comprises a CPU that includes said exclusive OR arithmetic circuit and an address controller executing said address control upon said address bus.

12. The device as set forth in claim 11, wherein said data unit matches a bit width of operations on said CPU.

13. A RAID storage device, comprising:

a plurality of data recording media; and an exclusive OR arithmetic circuit;

wherein:

original data are divided into a plurality of data strings and distributed and stored in said data recording media, and a redundant code data string found by means of an extended Galois field operation from said original data is stored in at least one of the data recording media;

each said data string is divided into a number of bit strings that accords with said extended Galois field operation;

said exclusive OR arithmetic circuit, taking a predetermined plural number of bits as a data unit, extracts vectors from the respective bit strings according to an operational expression which includes a companion matrix of a primitive polynomial of said extended Galois field, and executes exclusive OR operations among said vectors to carry out said extended Galois field operation without carrying out a bit shift operation in said vectors; and wherein the number of bits as elements constituting each of said vectors is equal to said data unit, and the operational expression is an operational expression for generating a redundant code data string or an operational expression for data string restoration.

14. The storage device as set forth in claim 13, further comprising a CPU equipped with said exclusive OR arithmetic circuit, wherein said data unit matches a bit width of operations on said CPU.

15. The storage device as set forth in claim 13, further comprising a CPU, wherein said exclusive OR arithmetic circuit is provided outside said CPU.

* * * * *